United States Patent [19]

Lindberg

[11] Patent Number: 5,640,763
[45] Date of Patent: Jun. 24, 1997

[54] METHOD FOR DEPANELIZING ELECTRICAL CIRCUITRY

[75] Inventor: Paul M. Lindberg, San Diego, Calif.

[73] Assignee: Pulse Engineering, Inc., San Diego, Calif.

[21] Appl. No.: 468,018

[22] Filed: Jun. 6, 1995

[51] Int. Cl.$^6$ .................................................. H05K 3/02
[52] U.S. Cl. .......................................... 29/846; 29/426.1
[58] Field of Search ............................... 29/846, 602.1, 29/610.1, 17.7, 426.1; 439/77; 428/901

[56] References Cited

U.S. PATENT DOCUMENTS 5,134,770  8/1992  Yerman et al. .................. 29/602.1 X
5,367,763  11/1994  Lam ................................... 29/846 X Primary Examiner—Peter Vo
Assistant Examiner—Khan Nguyen
Attorney, Agent, or Firm—Baker, Maxham, Jester & Meador

[57] ABSTRACT

A panel of a plurality of circuits to be separated into individual circuits, comprises a panel of conductive foil and insulator laminate formed into a plurality of separate circuits, a shear trace disposed between adjacent circuits, and a pull tab at one end of each of said the shear traces. In the depanelizing operation, the shear traces are pulled for cutting through the insulator to remove the corresponding circuits from the panel.

15 Claims, 3 Drawing Sheets

METHOD FOR DEPANELIZING ELECTRICAL CIRCUITRY

BACKGROUND OF THE INVENTION

The present invention relates to the manufacturing of electric circuits and pertains particularly to improved flex panels of circuitry and methods of manufacture.

Flex circuits are widely used in the electrical and electronic industry today in a wide variety of applications. A flex circuit is typically what is referred to as a printed circuit on a flexible backing or insulation sheet. The circuit tracings are typically formed of a metal foil, such a copper and the backing is usually a polymer, such as polyamide. Many printed circuits are made in large numbers on large sheets of laminates of copper foil and insulating polymer. The circuits are made in large numbers on the sheet by a photoetching process. This is a well-known process and it is not believed that details need to be given at this stage.

The circuits, once formed and completed on the sheet of laminate, are then separated into the individual circuit units. A number of techniques for carrying out this separation process are presently used. One process is by laser cutting by large expensive laser machines. This is a very expense process and requires expensive equipment which many small manufacturers cannot afford.

Another process of separating the circuits is by what is sometimes called a steel rule die. This involves the construction of a steel die forming the precise outline of the cut to be made and of the precise dimensions to cut out the individual circuit units. The die is mounted in and operated by a large hydraulic or pneumatic press. This also requires very expensive machinery and requires very accurate cutting dies. Any change in the circuit requires a complete reconstruction of the die. This is also a very expensive process.

Many smaller companies separate the circuits by means of an exacto knife. Workers very carefully and meticulously trace out the circuit with an exacto knife. One major difficulty with this process is that frequently small nicks are left in the insulating backing which results in tears and frequently shorting of the circuit. Some companies also have workers cut out the circuits with scissors. These two processes are laboriously time-consuming.

There is a need for a single effective and inexpensive method and structure for separating flex circuits from panels of circuits.

SUMMARY AND OBJECTS OF THE INVENTION

It is the primary object of the present invention to provide an improved flexible circuit structure and method of manufacturing of flexible electrical circuits.

In accordance with a primary aspect of the present invention, a method of manufacturing multiple circuits, comprises selecting a panel formed of a laminate of conductive foil and insulating backing sheet, forming a plurality of independent circuits on said panel, forming a cutting trace between adjacent ones of said circuits and pulling said cutting trace through said insulating sheet for separating said circuits from said panel.

BRIEF DESCRIPTION OF THE PREFERRED EMBODIMENTS

The above and other objects and advantages of the present invention will become apparent from the following description when read in conjunction with the accompanying drawings wherein.

DETAILED DESCRIPTION OF THE PREFERRED EMBODIMENTS

Figure 1:
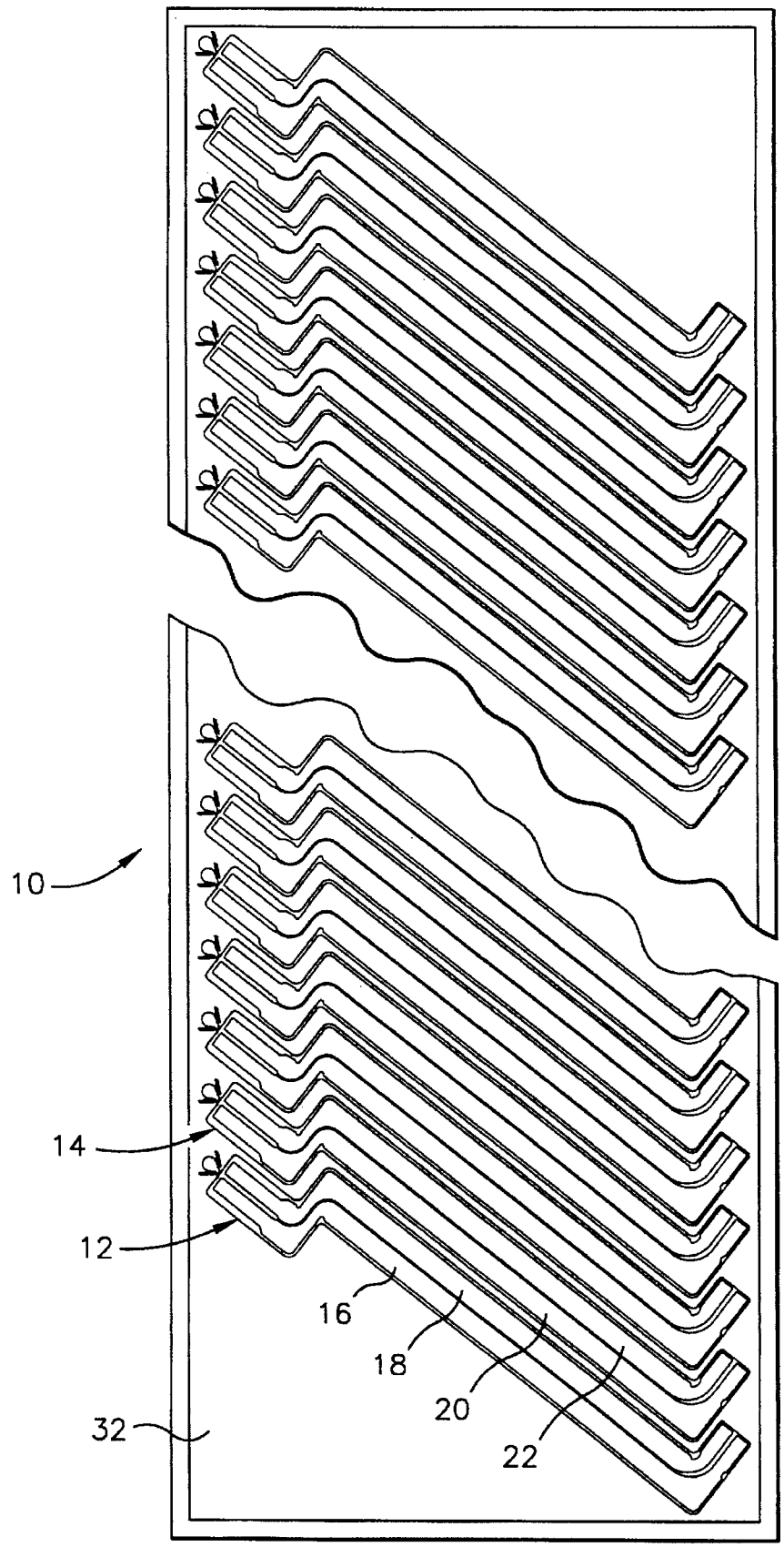
FIG. 1 is a top plan view of a flexible panel on which is formed a plurality of circuits in accordance with a preferred embodiment of the invention.

Referring to FIG. 1 of the drawing, there is illustrated a portion of a panel containing a plurality of circuits in accordance with the invention and designated generally by the numeral 10. The panel comprises a laminate of a thin sheet of conductive metal such as copper on a thin sheet of flexible plastic such as polyamide. The copper thickness is usually designated in terms of ounces per square foot and is usually two to five thousandths of an inch in thickness. The insulation backing is preferably constructed of a polyamide and is normally about one mil in thickness. The circuitry is formed by well known photoetching processes.

The illustrated panel contains some twenty circuits, only two of which designated generally by the numerals 12 and 14 will be described in some detail. The circuits are each formed of a pair of tape conductors 16, 18 and 20, 22, respectively.

Figure 2:
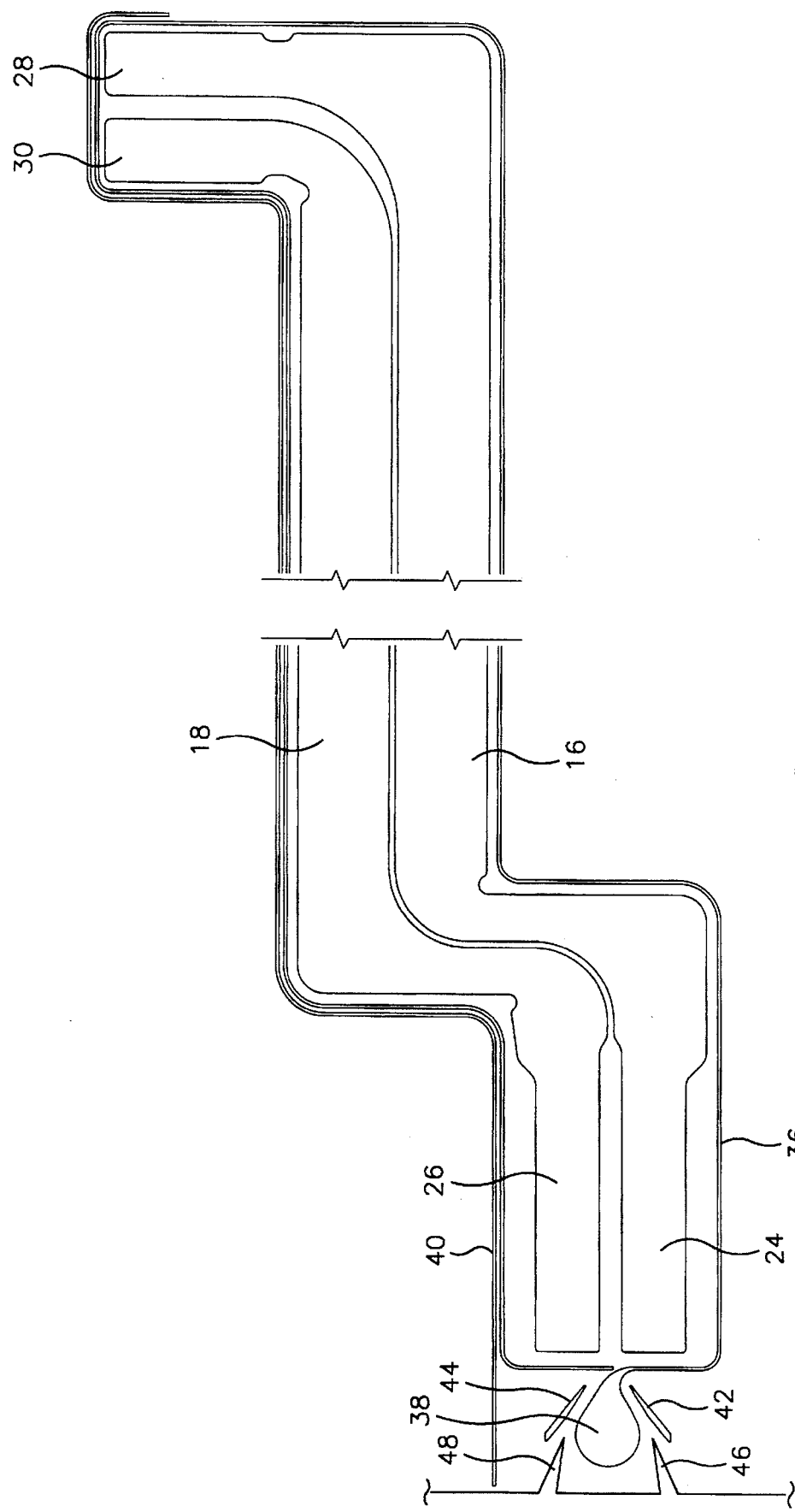
FIG. 2 is an enlarged top-plan view of a portion of the embodiment of FIG. 1 illustrating details of the structure of the present invention.

Referring now more specifically to FIG. 2, the circuit 12 will now be more fully described in detail. The circuit 12 is formed of two conductive tapes 16 and 18. These are each formed with proximal or front-end terminals 24 and 26, respectively, and distal or back-end terminals 28 and 30. The illustrated circuit is constructed to form the windings of coils such as disclosed in applicant's co-pending application Ser. No. 08/102,577, filed Aug. 5, 1993, now U.S. Pat. No. 5,534,838. These circuits are formed to be wound on cores to form the respective coils. The coils may be formed to function as choke coils or as transformers.

The circuits are formed as previously explained by a photoetching process applied to sheets of laminates of copper foil and a polymer backing. The circuits, as illustrated in FIG. 2, are formed and are supported on the polymer backing 32, which also serves as an insulator and primary support for the circuit elements.

Figure 5:
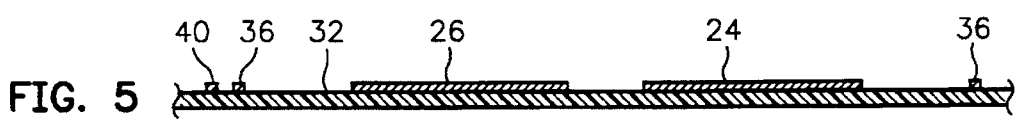
FIG. 5 is a section-view taken generally on line 5—5 of FIG. 3.

In accordance with the present invention, the circuit layout is provided with a cutting or shear trace 36 which has a pull-tab 38 at its beginning end. The shear trace begins at the pull tab 38 and completely encircles the circuit unit closely following the outline thereof terminating at a point just short of the beginning and adjacent to the pull tab 38. This shear trace is a strip of the copper foil formed by the photoetching process and functions to cut the circuit from the panel. It has a structure somewhat like a wire as seen in FIG. 5 and is preferably about seven to fifteen thousandths of an inch in width.

A cutting trace and pulltab assembly is provided for each of the circuits on the sheet. It will be noted that the circuits are closely spaced on the sheet to thereby maximize the yield of circuits for a given sheet of laminate. A guard trace 40 is disposed between and closely adjacent each cutting or shear trace and has somewhat the same size as seen in FIG. 5. It has a beginning end closely adjacent and between the beginning ends of adjacent circuits and a terminal end that wraps around and terminates adjacent and between distal terminal ends of adjacent circuits. The guard trace 40 is preferably from ten to thirty thousandths of an inch helps to stiffen and support the insulation sheet during the cutting or shearing process.

A pair of guide traces 42 and 44 is disposed adjacent each of the pull tabs 38 and angles inward forming a V embracing the pull tab. These are also formed by the photoetching process. A pair of starting nicks 46 and 48 are preferably formed and disposed between the guide traces and the pull tab 38. These are formed to enable a grasping and starting of the pull tab and shear trace. The nicks 46 and 48 make the starting of the tear by the pull tab 38 and shear trace 36 easier.

Figure 3:
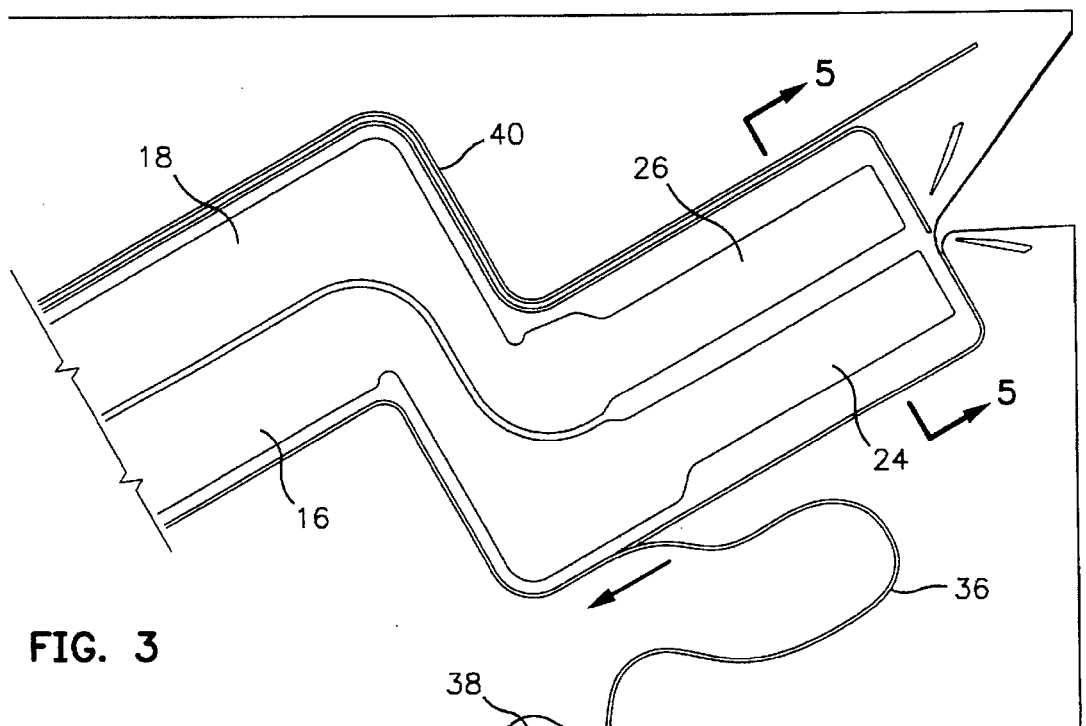
FIG. 3 is a partial view like FIG. 2 illustrating details of a step of the method of the present invention taken generally on line 3—3 of FIG. 2.

In operation, in order to remove or separate a circuit from a sheet of multiple circuits as illustrated in FIG. 1, the sheet is supported on a planar support surface with the circuit conductors face down as shown in FIG. 3, so that the insulating sheet is lying on top of the conductors. The pull tab 38 for the selected circuit is grasped between the thumb and forefinger and pulled upward and preferably slightly outward away from the circuit, while the adjacent area of the insulating sheet is being held down. Pulling the tab upward starts a tear or shearing of the insulating sheet at the starting nicks, such that as the tab is pulled further it begins pulling the cutting or shear trace through and simultaneously cutting the insulating sheet.

Figure 4:
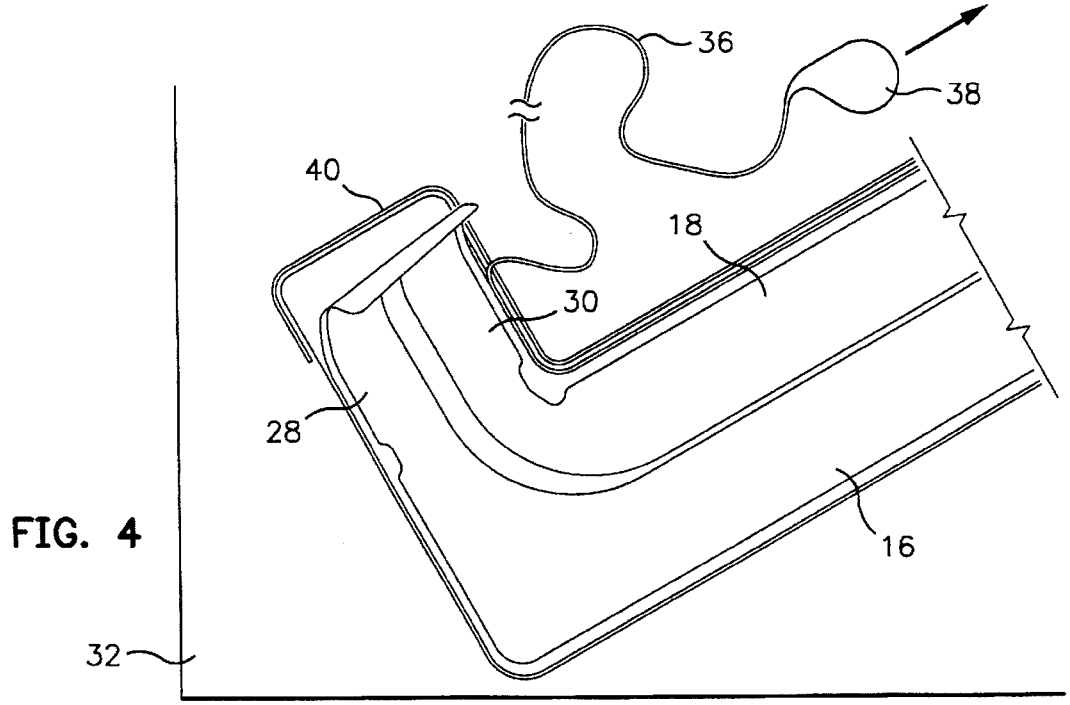
FIG. 4 is a view like FIG. 3 illustrating a further stage of the method.

The pull tab 38 and shear trace 36 is preferably pulled away from the circuit and in the direction of cutting. The shear trace is preferably pulled generally along and slightly away from the circuit as it proceeds around the circuit as shown in FIGS. 3 and 4. The shear or cutting trace in this manner effectively cuts through the insulating sheet separating each circuit from the overall sheet. This method provides a clean, efficient and accurate cut leaving the circuit supported on a cleanly cut backing insulator.

While I have illustrated and described my invention by means of specific embodiments, it is to be understood that numerous changes and modifications may be made therein without departing from the spirit and scope of the invention, as defined in the appended claims. For example, a single shear trace 36 could be formed in such a way as to enclose multiple circuits, and thus separate multiple circuits with one operation.

I claim:

1. A method of manufacturing multiple circuits, comprising:
    selecting a panel formed of a laminate of conductive foil and insulating backing sheet;
    forming a plurality of independent circuits on said panel;
    forming a shear trace of a thin strip between adjacent ones of said circuits on one side of said insulating sheet; and
    pulling each said thin strip through said insulating sheet from said one side to another side for separating said circuits from said panel; wherein the insulating sheet is cut along the shear trace.

2. A method according to claims 1 wherein said circuits are formed by etching.

3. A method according to claim 2 wherein each said shear trace is formed with a pull tab at one end for grasping.

4. A method according to claims 2 wherein said foil is copper.

5. A method according to claims 1 comprising the further step of forming a guide trace at a front end of each said shear trace.

6. A method according to claim 5 comprising the further step of forming a guard trace on said panel between adjacent shear traces.

7. A method according to claim 6 wherein each said shear trace is formed to encircle a circuit and with a pull tab at one end for grasping.

8. A method according to claim 7 comprising the further step of forming a guide trace and a starting nick at each side of said pull tab at front end of each said shear trace.

9. A method of manufacturing multiple circuits, comprising:
    selecting a panel formed of a laminate of conductive foil and insulating backing sheet;
    forming a plurality of independent circuits on said panel;
    forming a shear trace as a thin strip of said foil between adjacent ones of said circuits; and
    pulling each said thin strip through said insulating sheet from one side to another side for separating said circuits from said panel; wherein the insulating sheet is cut along the shear trace.

10. A method according to claim 9 wherein said circuit is formed as windings for a transformer.

11. A method of manufacturing panels of multiple circuits, comprising the steps of:
    selecting a flexible panel formed of a laminate of conductive foil and insulating backing sheet;
    forming a plurality of independent circuits on said panel;
    forming a separate shear trace of a thin strip on said backing sheet extending around each one of said circuits; and
    pulling a selected one of said thin strips through said insulating sheet from one side to another for separating a selected one of said circuits from said panel; wherein the insulating sheet is cut along the shear trace.

12. A method according to claim 11 wherein said step of forming said shear trace includes forming a pull tab at an end of each said shear trace.

13. A method according to claims 12 further comprising the step of forming a guard trace between adjacent shear traces.

14. A method according to claim 13 further comprising the step of forming a guide trace on each side of each said pull tab.

15. A method according to claim 14 further comprising forming a starter nick at each side of each said pull tab.

* * * * *